United States Patent
Hunter et al.

(10) Patent No.: US 7,049,048 B2
(45) Date of Patent: May 23, 2006

(54) ALKALI RESISTANT POLYMERIC INTERLAYERS FOR LITHOPLATES

(75) Inventors: Joseph Hunter, Fort Collins, CO (US); Saraiya Shashikant, Fort Collins, CO (US); Ting Tao, Fort Collins, CO (US); Fredéric Eugene Mikell, Greeley, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/928,339

(22) Filed: Aug. 27, 2004

(65) Prior Publication Data

US 2006/0046198 A1 Mar. 2, 2006

(51) Int. Cl.
G03F 7/038 (2006.01)
G03F 7/039 (2006.01)
G03F 7/09 (2006.01)
G03F 7/30 (2006.01)
G03F 7/14 (2006.01)

(52) U.S. Cl. .............. 430/278.1; 430/276.1; 430/302; 430/325; 430/326; 430/330; 430/525; 430/964; 101/257; 101/259; 428/461; 428/463

(58) Field of Classification Search ........... 430/276.1, 430/278.1, 525, 964, 302, 330, 325, 326; 428/461, 463; 101/257, 259
See application file for complete search history.

(56) References Cited

U.S. PATENT DOCUMENTS

| 3,220,832 | A | 11/1965 | Uhlig |
| 4,153,461 | A | 5/1979 | Berghäuser et al. |
| 4,689,272 | A | 8/1987 | Simon et al. |
| 4,935,332 | A | 6/1990 | Lauke et al. |
| 2003/0049564 | A1 | 3/2003 | Higashi et al. |
| 2003/0068578 | A1 | 4/2003 | Van Damme et al. |

FOREIGN PATENT DOCUMENTS

EP 1114734 * 7/2001

OTHER PUBLICATIONS

L.G. Hector, Jr., G.A. Nitowski, S.M. Opalka, L. Wieserman, Investigation of Vinyl Phophorous and Hydroxylated Alpha A1203 (0001) Reaction Enthalpies, Feb. 19, 2001.

N.G. Cave and A.J. Kinloch, Self-Assembling Monolayer Silane Films As Adhesion Promoters, Mechanical Engineering Department, Imperial College of Science, Technology and Medicine, Exhibition Road, London SW7 2BX, UK, Feb. 7, 1991 (Abstract).

Dr. Walter Held, Silicones Their Science, Production and Major Qualities, Centre Europeen Des Silicones, Jan. 2003.

* cited by examiner

Primary Examiner—Richard L. Schilling
(74) Attorney, Agent, or Firm—James L. Tucker

(57) ABSTRACT

Substrates for lithographic printing plate precursors and lithographic printing plate precursors are disclosed. The substrates comprise an aluminum or aluminum alloy support and the a layer of interlayer material on the support. The interlayer material is a co-polymer that comprise (1) acid groups and/or phosphonic acid groups, and (2) silyl groups substituted with three alkoxy and/or phenoxy groups. The lithographic printing plate precursors additionally comprise an imageable layer over the interlayer.

32 Claims, No Drawings

ALKALI RESISTANT POLYMERIC INTERLAYERS FOR LITHOPLATES

FIELD OF THE INVENTION

The invention relates to lithographic printing. In particular, this invention relates to interlayers for lithographic printing plate precursors.

BACKGROUND OF THE INVENTION

In conventional or "wet" lithographic printing, ink receptive regions, known as image areas, are generated on a hydrophilic surface. When the surface is moistened with water and ink is applied, the hydrophilic regions retain the water and repel the ink, and the ink receptive regions accept the ink and repel the water. The ink is transferred to the surface of a material upon which the image is to be reproduced. Typically, the ink is first transferred to an intermediate blanket, which in turn transfers the ink to the surface of the material upon which the image is to be reproduced.

Imageable elements useful as lithographic printing plate precursors typically comprise an imageable layer applied over the surface of a substrate. The imageable layer includes one or more radiation-sensitive components, which may be dispersed in a suitable binder. Alternatively, the radiation-sensitive component can also be the binder material. Following imaging, either the imaged regions or the unimaged regions of the imageable layer are removed by a suitable developer, revealing the underlying hydrophilic surface of the substrate. Developers are typically aqueous alkaline solutions, which may also contain substantial amounts of organic solvents. If the imaged regions are removed, the precursor is positive working. Conversely, if the unimaged regions are removed, the precursor is negative working. In each instance, the regions of the imageable layer (i.e., the image areas) that remain are ink-receptive, and the regions of the hydrophilic surface revealed by the developing process accept water and aqueous solutions, typically a fountain solution, and repel ink.

The substrate typically comprises a support of aluminum or an aluminum alloy that has been treated to form a layer of aluminum oxide of its surface. The substrate may also comprise an interlayer on one or both surfaces of the substrate to modify the surface characteristics to enhance the hydrophilicity of the surface of the support, to improve adhesion to subsequent layers to the substrate, to protect the oxide from dye penetration of the imageable layer, and to protect the oxide layer during the development process. Typical interlayer materials are polyvinyl phosphonic acid (PVPA), vinyl phosphonic acid/acrylic acid (VPA/AA) co-polymers, and polyacrylic acid (PAA).

Current interlayer materials compatible with positive and negative-type imageable layers do not adequately protect the oxide layer of the support from high pH alkali developers. This causes decreased developer activity, increased developer replenishment, sludging in the processor and filter, and increased maintenance of the processor. Thus, a need exists for imageable elements that comprise an interlayer that protects the oxide layer of the support from high pH alkali developers, and can be used for a wide range of imageable layers.

SUMMARY OF THE INVENTION

In one aspect, the invention is a substrate comprising a support and an interlayer on the support, in which:
the support comprises aluminum or an aluminum alloy;
the interlayer comprises an interlayer material;
the interlayer material is a co-polymer comprising K units and L units;
K is selected from $-[CH_2C(R^1)CO_2H]-$, $-[CH_2CH(PO(OH)_2)]-$, and mixtures thereof;
L is $-[CH_2C(R^2)(WSi(OR^3)_3)]-$
$R^1$ is hydrogen or methyl;
$R^2$ is hydrogen or methyl;
W is a bivalent linking group, a combination of bivalent linking groups, or a mixture of bivalent linking groups; and
each $R^3$ is independently phenyl, or alkyl of one to six carbon atoms.

In another aspect, the invention is a co-polymer comprising K units and L units. In another aspect, the invention is an imageable element comprising an imageable layer over the interlayer of the substrate. In yet another aspect, the invention is a method for forming an image by imaging the imageable element and developing the resulting imaged imageable element.

DETAILED DESCRIPTION OF THE INVENTION

Unless the context indicates otherwise, in the specification and claims the terms surfactant, interlayer material, photothermal conversion material, co-polymer, co-binder, monomer, coating solvent, and similar terms also include mixtures of such materials. Unless otherwise specified, all percentages are percentages by weight. Thermal imaging refers to imaging with a hot body, such as a thermal head, or with infrared radiation.

Interlayer Materials

The interlayer materials are co-polymers that comprise (1) acid groups and/or phosphonic acid groups, and (2) silyl groups substituted with three alkoxy and/or phenoxy groups. These co-polymers comprise K units and L units. The K units comprise the acid groups and/or the phosphonic groups. The K units typically comprise about 50 wt % to about 99 wt %, preferably about 70 wt % to about 99 wt % of the co-polymer. The L units comprise the silyl groups. The L units typically comprise about 1 wt % to about 50 wt %, preferably about 1 wt % to about 30 wt %, of the co-polymer. Small amounts of units derived from other monomers may be present, but are not required.

The K units are selected from $-[CH_2C(R^1)CO_2H]-$, $-[CH_2CH(PO(OH)_2)]-$, and mixtures thereof. $R^1$ is hydrogen, methyl, or a mixture thereof.

The L units are $-[CH_2C(R^2)(WSi(OR^3)_3)]-$. $R^2$ is hydrogen or methyl. W is a bivalent linking group, a combination of bivalent linking groups, or a mixture of bivalent linking groups. Each $R^3$ is independently phenyl, or alkyl of one to six carbon atoms. Bivalent linking groups include, for example, the carbon-silicon single bond (i.e., the L unit has the structure: $-[CH_2CH(R^2)-Si(OR^3)_3])-$); oxygen ($-O-$); carbonyl ($-C(O)-$); carboxy ($-CO_2-$); alkylene groups ($-(CH_2)_m-$) containing 1 to 8 carbon atoms (m is 1 to 8); and phenylene ($-(C_6H_4)-$) groups, such as the o-, m-, and p-phenylene groups. Combinations of these groups may also be used. Preferred groups include the carbon-silicon single bond, the phenylene group, alkylene groups containing 2 to 6 carbon atoms (i.e., the L unit has the structure $[CH_2CH(R^2)(CH_2)_mSi(OR^3)_3]-$), in which m is 2 to 6); and carboxy alkyl groups of the formula $-CO_2(CH_2)_m-$, in which m is 2 to 6 (i.e., the L unit has the structure $-[CH_2CH(R^2)(CO_2(CH_2)_mSi(OR^3)_3)]-$).

Preparation of the Interlayer Materials

The interlayer materials may be prepared by free radical polymerization. In a typical preparation, a mixture of monomers, one or more monomers that are the precursor of the K unit and one or more monomers that are the precursor of the L unit, are co-polymerized.

Free radical polymerization is well known to those skilled in the art and is described, for example, in Chapters 20 and 21, of *Macromolecules*, Vol. 2, 2nd Ed., H. G. Elias, Plenum, New York, 1984. Useful free radical initiators are peroxides such as benzoyl peroxide, hydroperoxides such as cumyl hydroperoxide and azo compounds such as 2,2'-azobis (isobutyronitrile) (AIBN). Chain transfer agents, such as dodecyl mercaptan, may be used to control the molecular weight of the compound. Suitable solvents for free radical polymerization include liquids that are inert to the reactants and which will not otherwise adversely affect the reaction, for example, water; esters such as ethyl acetate and butyl acetate; ketones such as methyl ethyl ketone, methyl isobutyl ketone, methyl propyl ketone, and acetone; alcohols such as methanol, ethanol, isopropyl alcohol, and butanol; ethers such as dioxane and tetrahydrofuran; and mixtures thereof.

Precursors for the K units include, for example, acrylic acid, methacrylic acid, and vinylphosphonic acid (VPA).

Precursors of the L unit include, for example, vinyl trimethoxysilane, vinyl triethoxysilane, vinyl tributoxysilane, allyl trimethoxysilane, allyl triethoxysilane, 4-(trimethoxysilyl)-1-butene, 2-(trimethoxysilyl)ethyl acrylate, 2-(trimethoxysilyl)ethyl methacrylate, 3-(trimethoxysilyl) propyl acrylate, 3-(trimethoxysilyl)propyl methacrylate, 3-(triethoxysilyl)propyl acrylate, 3-(trimethoxysilyl)propyl methacrylate, 3-(tripropoxysilyl)propyl acrylate, 3-(tripropoxysilyl)propyl methacrylate, 3-(tributoxysilyl)propyl acrylate, 3-(tributoxysilyl)propyl methacrylate, 4-(trimethoxysilyl)butyl acrylate, 4-(trimethoxysilyl)butyl methacrylate, 5-(trimethoxysilyl)pentyl acrylate, 5-(trimethoxysilyl) pentyl methacrylate, 6-(trimethoxysilyl)hexyl acrylate, 6-(trimethoxysilyl) hexyl methacrylate, and mixtures thereof. Preferred precursors for the L unit include monomers of the structure: $CH_2\!\!=\!\!C(R^1)(CO_2(CH_2)_m Si(OCH_3)_3)$, in which $R^1$ is hydrogen or methyl and m is 2 to 6, such as 2-(trimethoxysilyl)ethyl acrylate, 2-(trimethoxysilyl)ethyl methacrylate, 3-(trimethoxysilyl)propyl acrylate, 3-(trimethoxysilyl)propyl methacrylate, 4-(trimethoxysilyl)butyl acrylate, 4-(trimethoxysilyl)butyl methacrylate, 5-(trimethoxysilyl)pentyl acrylate, 5-(trimethoxysilyl)pentyl methacrylate, 6-(trimethoxysilyl)hexyl acrylate, 6-(trimethoxysilyl)hexyl methacrylate, and mixtures thereof.

Although preparation of the co-polymers has been explained in terms of monomers that can be used to form the co-polymers, this does not limit the copolymers to those formed by polymerization of the indicated monomers. The copolymers may be formed by other routes that will be apparent to those skilled in the art, such as by modification of precursor polymers. For example, the co-polymer may be formed by addition of a —$Si(OR^3)_3$ group, or a —WSi(OR³)₃ group, to an appropriate precursor polymer.

Preparation of the Substrates

The substrate comprises a sheet of aluminum or an aluminum alloy of sufficient thickness to sustain the wear from printing and thin enough to wrap around a cylinder in a printing press, typically about 100 μm to about 600 μm. Before the interlayer is coated on the support, it is cleaned, roughened, and anodized by various methods known in the art. Initially, a degreasing treatment with a surfactant, an organic solvent, or an alkaline water solution is typically administered to remove oil and grease from the surface of the sheet. Then the surface may be roughened by well known techniques, such as mechanical roughening, for example ball polishing, brush polishing, blast polishing and buff polishing, chemical roughening in which the surface is roughened by selectively dissolving the surface, or electrochemical roughening, or a combination of such chemical, mechanical, and/or electrochemical treatments (multi-graining).

Etching of the substrate is performed using hot acidic (such as sulfuric or phosphoric) solutions or alkaline solutions (such as sodium hydroxide or trisodium phosphate mixed with sodium hydroxide). This procedure removes by-product from the graining process to expose the graining structure, at times to amend it by rounding the sharp peaks, and at times to lighten the substrate color for improved contrast to the imaged layer.

Then anodic oxidation is carried out to form a hydrophilic layer of aluminum oxide on the surface, typically a layer of aluminum oxide least 0.3 g/m² in weight. Various electrolytes can be used for the anodic oxidation, such as sulfuric acid, phosphoric acid, chromic acid, boric acid, citric acid, oxalic acid, or a mixture thereof. Anodic oxidation is performed by passing a current using the support as an anode in an electrolytic solution comprising the electrolyte. The concentration of the electrolyte and the conditions of the anodic oxidization process vary according to the electrolyte used, but typically conditions include an electrolyte concentration of 1 to 80 wt %, the electrolyte temperature of 5° C. to 70° C., current density of 5 to 60 A/dm², voltage from 1 to 100 V, and electrolysis time from 10 sec to 50 min. Anodic oxidation is disclosed, for example, in Fromson, U.S. Pat. No. 3,280,734, and Chu, U.S. Pat. No. 5,152,158.

Then the interlayer is formed on top of the aluminum oxide layer to form the substrate. The interlayer may be formed by dipping the support into 0.01–10% hot solution of the interlayer material in water. Preferably, the solution is at 30 to 90° C., and the support is dipped into the solution for about 3 sec to about 60 sec. More preferably, the solution is at 50–70° C., and the support is dipped into the solution for about 10 sec to about 30 sec. Alternatively, the interlayer material may be coated onto the support by conventional methods, such as spin coating, bar coating, gravure coating, die coating, slot coating, or roller coating in a water or organic solvent solution.

The back side of the support (i.e., the side opposite the imageable layer) may be coated with an antistatic agent and/or a slipping layer or matte layer to improve handling and "feel" of the imageable element.

Imageable Element

The imageable element comprises an imageable layer over the interlayer of the substrate. The imageable layer may be on the interlayer or there may be one of more layers between the interlayer and the imageable layer. The imageable layer comprises an imageable composition. Imageable compositions are well known to those skilled in the art and are disclosed in numerous publications and patents. Any composition used in imageable elements useful as lithographic printing plate precursors may be used in the imageable elements of the invention. The substrates of the invention are suitable for use in imageable elements imageable with ultraviolet, violet, visible, and/or infrared radiation, and/or by thermal exposure. The imageable elements may be, for example, positive- or negative-working, preheat or no-preheat, bakeable or non-bakeable novalac, diazo, or photopolymers systems, including on press developable imageable elements. These imageable elements are well known to those skilled in the art and are described in numerous publications and patents, such as Photoreactive Polymers: *The Science and Technology of Resists*, A. Reiser, Wiley, New York, 1989, pp. 102–177; "Photopolymers: Radiation Curable Imaging Systems," by B. M. Monroe, in Radiation Curing: Science and Technology, S. P. Pappas, Ed., Plenum, New York, 1992, pp. 399–440; and "Polymer Imaging" by A. B. Cohen and P. Walker, *Imaging Processes and Material*, J. M. Sturge, et al., Eds, Van Nostrand Reinhold, New York, 1989, pp. 226–262.

Single layer elements comprise a layer of an imageable composition, known as the top layer or imageable layer, on the interlayer. Imageable compositions that contain conventional diazo resins may be used. They are described, for example, in Chapter 5 of *Photoreactive Polymers: the Science and Technology of Resists*, A. Reiser, Wiley, New York, 1989, pp. 178–225. These compositions comprise a polymeric diazo resin or a mixture of polymeric diazo resins. A variety of such materials are known in the art. Especially useful polymeric diazo resins are reaction products of diphenylamine-4-diazonium salts, optionally having a methoxy group in the phenyl group bearing the diazo group, with formaldehyde or 4,4-bis-methoxymethyl diphenyl ether. Dihydrogen phosphate, hexafluorophosphate, hexafluoroantimonate, hexafluoroarsenate, tetrafluoroborate, and aromatic sulfonates such as 4-tolyl-sulfonate or mesitylene sulfonate are particularly suitable counterions for these polymeric diazo resins. These resins are typically used with an added binder, such as is described in Baumann, U.S. Pat. No. 5,700,619, incorporated herein by reference. Binders include, for example, polymeric acetal resins, such as are disclosed in U.S. Patent Publication U.S. 2003/0198887. Hybrid systems comprising a polymeric diazo resin and a free radical polymerizable system consisting of photoinitiators and free radical polymerizable components may also be used in the imageable layer. Useful developers include aqueous alkaline solution such as those that comprise an alkali metal silicate or metasilicate, such as are described below.

Negative working imageable compositions that comprise a free radical polymerizable compound, generally known as a monomer, and a free radical generating system (initiator system), can be used in the imageable layer. These compositions are disclosed, for example, in *Photoreactive Polymers: the Science and Technology of Resists*, A. Reiser, Wiley, New York, 1989, pp. 102–177; "Photopolymers: Radiation Curable Imaging Systems," by B. M. Monroe, in *Radiation Curing: Science and Technology*, S. P. Pappas, Ed., Plenum, New York, 1992, pp. 399–440; and "Polymer Imaging" by A. B. Cohen and P. Walker, in *Imaging Processes and Materials*, J. M. Sturge, et al., Eds, Van Nostrand Reinhold, New York, 1989, pp. 226–262. These compositions comprise at least one ethylenically unsaturated compound that undergoes free radical initiated polymerization, generally known as a monomer, a binder, and a free radical generating system. Typical compositions are, by weight, binder(s) 25 to 90%, preferably 45 to 75%; monomer(s), 5 to 60%, preferably, 15 to 50%; photoinitiator system, 0.01 to 10%, preferably 0.1 to 5%; and other ingredients, 0 to 5%, typically 0 to 4% The developer can be an organic solvent, aqueous or semi-aqueous solution, or water. The choice of the developer will depend primarily on the chemical nature of the free radical polymerizable compound and, if present, the binder. Semi-aqueous developers usually contain water and a water miscible organic solvent and an alkaline material. Aqueous developers usually contain water and an alkaline material.

Imageable compositions that comprise a QHB-modified monomer are disclosed in Published U.S. Pat. Appln. No. U.S. 2004/0091812, incorporated herein by reference. These compositions comprise a free radical generating system and a QHB-modified free radical polymerizable compound having the structure: $(P)_m B(O)_n$, in which: Q is a moiety that comprises a QHB unit; P is a moiety that comprises at least one free radical polymerizable group; B is a supporting backbone; and $m \geq 1$ and $n \geq 1$. Free radical polymerizable compounds containing the QHB unit are also disclosed in Published U.S. Pat. Appln. No. U.S. 2004/0034190. A QHB-modified monomer comprises a QHB (quadruple hydrogen bonding) unit, which is capable of forming four or more, typically four, hydrogen bonds with similar or complementary units on other molecules or portions of molecules. Polymeric molecules that, in pairs, form at least four hydrogen bonds with one another are disclosed in Sijbesma, U.S. Pat. No. 6,320,018.

Negative working imageable compositions are also disclosed, for example, in Haley, U.S. Pat. No. 5,372,907; Nguyen, U.S. Pat. No. 5,919,601; Kobayashi, U.S. Pat. No. 5,965,319; Busman, U.S. Pat. No. 5,763,134; WO 00/17711, and U.S. patent application Ser. No. 10/155,696, filed May 24, 2002, the disclosures of which are all incorporated herein by reference. These precursors comprise an imageable layer over a lithographic substrate. The imageable layer comprises a photothermal conversion material, an acid generator, an acid activatable crosslinking agent, and a polymeric binder. The acid generators include precursors that form a Brönsted acid by thermally initiated decomposition. Non-ionic acid generators include haloalkyl-substituted s-triazines, such as 2-phenyl-4,6-bis(trichloromethyl)-s-triazine. Ionic acid generators include onium salts such as diphenyl iodonium chloride, triphenyl sulfonium hexafluoroantimonate, triphenyl sulfonium tetrafluoroborate, 2-methoxy-4-aminophenyl diazonium hexafluorophosphate, 4,4'-dicumyl iodonium p-tolyl sulfate, and 2-methoxy-4-(phenylamino)-benzenediazonium octyl sulfate. Haley, U.S. Pat. No. 5,372,907, discloses a radiation-sensitive composition in which a novolac resin is the polymeric binder and a resole resin is the acid activatable crosslinking agent. Nguyen, U.S. Pat. No. 5,919,601, discloses radiation-sensitive compositions in which the polymeric binder contains reactive pendant groups selected from hydroxy, carboxylic acid, sulfonamide, and alkoxymethylamides; and the polymeric resin is a resole resin, a $C_1$–$C_5$ alkoxymethyl melamine or glycoluril resin, a poly($C_1$–$C_5$-alkoxymethylstyrene), a poly($C_1$–$C_5$-alkoxymethylacrylamide), a derivative thereof, or a combination thereof.

When the imageable composition comprises a photothermal conversion material, an acid generator, an acid activatable crosslinking agent, and a polymeric binder, it can be developed in a developer, which removes the unimaged regions. Typically, the imaged imageable element is heated at about 28° C. or less below the fog point at a heating time of two minutes, more preferably about 17° C. or less below the fog point at a heating time of two minutes and most preferably about 8° C. below the fog point before developing. A conventional aqueous alkaline solution can be used as a developer. Useful developers are aqueous solutions having a pH of about 7 or above. These developer typically have a pH between 8 and about 13.5 and comprise at least one alkali metal silicate. Typical commercially available high pH developers include: ProTherm™ Developer, Greenstar™

Developer, Goldstar™ Developer, 4030 Developer, PD-1 Developer, and MX 1710 Developer, all available from Kodak Polychrome Graphics, Norwalk, Conn.

Other thermally imageable, single layer elements are disclosed, for example, in West, U.S. Pat. No. 6,090,532; Parsons, U.S. Pat. No. 6,280,899; McCullough, U.S. Pat. Pub. No. 2002/0136961; and WO99/21715, the disclosures of which are all incorporated herein by reference. The imageable composition comprises an ink-receptive polymeric material, known as a binder, a dissolution inhibitor, a photothermal conversion material, and an alkali soluble copolymer described above or a mixture of the alkali soluble copolymers described above. Alternatively, or additionally, the polymeric material may comprise polar groups and acts as both the binder and dissolution inhibitor. Other materials that are conventional components of the imageable layer of single layer imageable elements may also be present. Preferably, the binder in the single layer imageable element is a light-stable, water-insoluble, developer-soluble, film-forming phenolic resin. Novolac resins are preferred.

The imageable layer preferably comprises a dissolution inhibitor, which functions as a solubility-suppressing component for the first binder. Dissolution inhibitors have polar functional groups that are believed to act as acceptor sites for hydrogen bonding with the hydroxyl groups present in the binder. The acceptor sites comprise atoms with high electron density, preferably selected from electronegative first row elements, especially carbon, nitrogen, and oxygen. Dissolution inhibitors that are soluble in the developer are preferred. Useful polar groups for dissolution inhibitors include, for example, diazo groups; diazonium groups; keto groups; sulfonic acid ester groups; phosphate ester groups; triarylmethane groups; onium groups, such as sulfonium, iodonium, and phosphonium; groups in which a nitrogen atom is incorporated into a heterocyclic ring; and groups that contain a positively charged atom, especially a positively charged nitrogen atom, typically a quaternized nitrogen atom, i.e., ammonium groups. Compounds that contain a positively charged (i.e., quaternized) nitrogen atom useful as dissolution inhibitors include, for example, tetraalkyl ammonium compounds, and quaternized heterocyclic compounds such as quinolinium compounds, benzothiazolium compounds, pyridinium compounds, and imidazolium compounds. The dissolution inhibitor may be a monomeric and/or polymeric compound that comprises an o-diazonaphthoquinone moiety. A preferred group of dissolution inhibitors are triarylmethane dyes, such as ethyl violet, crystal violet, malachite green, brilliant green, Victoria blue B, Victoria blue R, Victoria blue BO, BASONYL® Violet 610, and D11 (PCAS, Longjumeau, France). These compounds can also act as contrast dyes, which distinguish the unimaged regions from the imaged regions in the developed imageable element.

Alternatively, or additionally, the polymeric material in the imageable layer can comprise polar groups that act as acceptor sites for hydrogen bonding with the hydroxy groups present in the first binder, and, thus, act as both the first binder and dissolution inhibitor. The level of derivatization should be high enough that the polymeric material acts as a dissolution inhibitor, but not so high that, following thermal imaging, the polymeric material is not soluble in the developer. Although the degree of derivatization required will depend on the nature of the polymeric material and the nature of the moiety containing the polar groups introduced into the polymeric material, typically about 0.5 mol % to about 5 mol %, preferably about 1 mol % to about 3 mol %, of the hydroxyl groups will be derivatized. Derivatization of phenolic resins with compounds that contain the diazonaphthoquinone moiety is well known and is described, for example, in West, U.S. Pat. Nos. 5,705,308, and 5,705,322. One group of binders that comprise polar groups and function as dissolution inhibitors are derivatized phenolic polymeric materials in which a portion of the phenolic hydroxyl groups have been converted to sulfonic acid esters, preferably phenyl sulfonates or p-toluene sulfonates. Derivatization can be carried out by reaction of the polymeric material with, for example, a sulfonyl chloride such as p-toluene sulfonyl chloride in the presence of a base such as a tertiary amine. A useful material is a novolac resin in which about 1 mol % to 3 mol %, preferably about 1.5 mol % to about 2.5 mol %, of the hydroxyl groups have been converted to phenyl sulfonate or p-toluene sulfonate (tosyl) groups. Useful developers include aqueous alkaline solution such as those that comprise an alkali metal silicate or metasilicate, such as are described below.

A composition useful in the imageable layer of on press developable imageable elements is disclosed, for example, in Huang, Pat. Pub. U.S. 2003/0064318 A1, incorporated herein by reference. An imageable layer comprises a polymerizable compound and a polymeric binder that comprises a polymer backbone and polyethylene oxide side chains may be used. Other on press developable imageable elements are disclosed in Leon, U.S. Pat. No. 6,365,705 an U.S. Pat. No. 6,447,978; Fleming, U.S. Pat. No. 6,593,055; and U.S. Pat. Appln. Ser. No. 10/747,643, filed Dec. 29, 2003, the disclosures of which are incorporated herein by reference.

Multilayer elements comprise a top layer or imageable layer over an underlayer. Other layers, such as an absorber layer and/or a barrier layer may also be present. Any imageable layer conventionally used in multi-layer, positive working, alkaline developable, thermally imageable elements may be used in the multilayer imageable elements. These elements are disclosed, for example, in Shimazu, U.S. Pat. No. 6,294,311, U.S. Pat. No. 6,352,812, and U.S. Pat. No. 6,593,055; Patel, U.S. Pat. No. 6,352,811, and U.S. Pat. No. 6,723,490; Hauck, U.S. Pat. No. 6,358,669; Savariar-Hauck, U.S. Pat. No. 6,528,228; and Kitson, U.S. Pat. Pub. No. 2004/0067432 A1; the disclosures of which are all incorporated herein by reference.

The imageable layer of a multilayer imageable element is over the underlayer. The imageable layer becomes soluble or dispersible in the developer following thermal exposure. It typically comprises an ink-receptive polymeric material, known as the binder, and a dissolution inhibitor. Alternatively, or additionally, the polymeric material comprises polar groups and acts as both the binder and dissolution inhibitor. Other materials that are conventional components of the imageable layer of multilayer imageable elements may also be present. The imageable layer of a multilayer element is typically similar to the imageable layer of the single layer imageable elements described above, with the exception that the alkali soluble copolymer or mixture of alkali soluble copolymers, is typically not present.

Binders for the imageable layer of multilayer imageable elements are light-stable, water-insoluble, developer-soluble, film-forming phenolic resins, such as novolac resins. In some cases, it may be desirable to include a novolac resin in the imageable layer with the highest weight average molecular weight that maintains its solubility in common coating solvents, such as acetone, tetrahydrofuran, and 1-methoxypropan-2-ol. Imageable layers comprising novolac resins, including for example m-cresol only novolac resins (i.e. those that contain at least about 97 mol % m-cresol) and m-cresol/p-cresol novolac resins that have up to 10 mol % of p-cresol, having a weight average molecular weight of about 10,000 to at least about 25,000, may be used. Imageable layers comprising m-cresol/p-cresol novolac resins with at least 10 mol % p-cresol, having a weight average molecular weight of about 8,000 to about 25,000, may also be used. In some instances, novolac resins prepared by solvent condensation may be desirable. Dissolution inhibitors for the imageable layer of multilayer imageable elements are described above.

The underlayer is between the substrate and the imageable layer and is typically on the interlayer. After imaging, it is removed along with the imageable layer by the developer in the imaged regions to reveal the underlying hydrophilic surface of the substrate. The polymeric material, which will be referred to as the second binder, in the underlayer is preferably soluble in the developer to prevent sludging of the developer. In addition, it is preferably insoluble in the solvent used to coat the imageable layer so that the imageable layer can be coated over the underlayer without dissolving the underlayer. Particularly useful binders for the underlayer are copolymers that comprise N-substituted maleimides, especially N-phenylmaleimide; polyvinylacetals; methacrylamides, especially methacrylamide; and acrylic and/or methacrylic acid, especially methacrylic acid. More preferably, two functional groups are present in the polymeric material, and most preferably, all three functional groups are present in the polymeric material. The preferred polymeric materials of this type are copolymers of N-phenylmaleimide, methacrylamide, and methacrylic acid, more preferably those that contain, in polymerized form, about 25 to about 75 mol %, preferably about 35 to about 60 mol % of N-phenylmaleimide; about 10 to about 50 mol %, preferably about 15 to about 40 mol % of methacrylamide; and about 5 to about 30 mol %, preferably about 10 to about 30 mol %, of methacrylic acid. Other hydrophilic monomers, such as hydroxyethyl methacrylate, may be used in place of some or all of the methacrylamide. Other alkaline soluble monomers, such as acrylic acid, may be used in place of some or all of the methacrylic acid.

The underlayer may also comprise a resin or resins having activated methylol and/or activated alkylated methylol groups. Such resins include, for example: resole resins and their alkylated analogs; methylol melamine resins and their alkylated analogs, for example melamine-formaldehyde resins; methylol glycoluril resins and alkylated analogs, for example, glycoluril-formaldehyde resins; thiourea-formaldehyde resins; guanamine-formaldehyde resins; and benzoguanamine-formaldehyde resins. Commercially available melamine-formaldehyde resins and glycoluril-formaldehyde resins include, for example, CYMEL® resins (Dyno Cyanamid) and NIKALAC® resins (Sanwa Chemical).

The resin or resins having activated methylol and/or activated alkylated methylol groups is preferably a resole resin or a mixture of resole resins. Resole resins are well known to those skilled in the art. They are prepared by reaction of a phenol with an aldehyde under basic conditions using an excess of phenol. Commercially available resole resins include, for example, GP649D99 resole (Georgia Pacific) and BKS-5928 resole resin (Union Carbide).

The underlayer typically comprises about 50 wt % to about 75 wt %, preferably about 55 wt % to 70 wt %, of the second binder or mixture of second binders, based on the dry weight of the underlayer; about 5 wt % to about 20 wt %, preferably about 7 wt % to 15 wt %, of the resin or mixture of resins having activated methylol and/or activated alkylated methylol groups, based on the dry weight of the underlayer; about 5 wt % to about 25 wt %, preferably about 10 wt % to 20 wt %, of the photothermal conversion material, based on the dry weight of the underlayer; and about 3 wt % to about 30 wt %, preferably about 5 wt % to 20 wt %, of the alkali soluble copolymer or mixture of alkali soluble copolymers, based on the dry weight of the underlayer.

Although not essential, the underlayer of a multilayer imageable element typically comprises the photothermal conversion material. Alternatively, the photothermal material may be in the imageable layer or in a separate absorber layer.

When an absorber layer is present, it is between the imageable layer and the substrate. When an underlayer is also present, the absorber layer is between the imageable layer and the underlayer. The absorber layer preferably consists essentially of the infrared absorbing compound and, optionally, a surfactant. It may be possible to use less of the infrared absorbing compound if it is present in a separate absorber layer rather than either the underlayer and/or the imageable layer. When an absorber layer is present, the imageable layer is preferably substantially free of infrared absorbing compound, i.e. the imageable layer preferably does not absorb radiation used for imaging, typically radiation in the range of 800 nm to 1200 nm. The absorber layer preferably has a thickness sufficient to absorb at least 90%, preferably at least 99%, of the imaging radiation. Typically, the absorber layer has a coating weight of about 0.02 $g/m^2$ to about 2 $g/m^2$, preferably about 0.05 $g/m^2$ to about 1.5 $g/m^2$. Elements that comprise an absorber layer are disclosed in Shimazu, U.S. Pat. No. 6,593,055.

To minimize migration of the photothermal conversion material from the underlayer to the imageable layer during manufacture and storage of the imageable element, the element may comprise a barrier layer between the underlayer and the imageable layer. The barrier layer comprises a polymeric material that is soluble in the developer. If this polymeric material is different from the polymeric material in the underlayer, it is preferably soluble in at least one organic solvent in which the polymeric material in the underlayer is insoluble. A preferred polymeric material for the barrier layer is polyvinyl alcohol. When the polymeric material in the barrier layer is different from the polymeric material in the underlayer, the barrier layer should be less than about one-fifth as thick as the underlayer, preferably less than a tenth of the thickness of the underlayer.

Imaging and Processing of the Imageable Elements

Depending on the nature of the imageable element, it is imaged with ultraviolet, violet, visible, or infrared radiation, or by thermal exposure. The apparatus and techniques for imaging imageable elements are well known to those skilled in the art. The element may be imaged by exposure through a suitable imaging master or photomask, such as a silver halide film. Any convenient source or sources of radiation providing wavelengths in the region of the spectrum that overlap the absorption bands of the radiation sensitive component or components of the imageable element can be used for imaging. Conventional light sources, which are used with a photomask, include fluorescent lamps, mercury vapor lamps, metal additive lamps, carbon arc lamps, tungsten filament lamps and photoflood lamps. Alternatively the element may be digitally imaged with a laser emitting in the ultraviolet or visible, such as a xenon, argon ion, or ionized neon laser, a tunable dye laser, or a frequency doubled neodymium:YAG laser.

Imaging with infrared radiation may be carried out with a laser or an array of lasers emitting modulated near infrared or infrared radiation in a wavelength region that is absorbed by the imageable element. Infrared radiation, especially infrared radiation in the range of about 800 nm to about 1200 nm, is typically used for imaging. Imaging is conveniently carried out with a laser emitting at about 830 nm, about 1056 nm, or about 1064 nm. Suitable commercially available imaging devices include image setters such as the CREO® Trendsetter (Creo, Burnaby, British Columbia, Canada), the Screen PlateRite model 4300, model 8600, and model 8800 (Screen, Rolling Meadows, Chicago, Ill., USA), and the Gerber Crescent 42T (Gerber).

Imaging with infrared radiation may be carried out with a laser or an array of lasers emitting modulated near infrared or infrared radiation in a wavelength region that is absorbed by the element. Infrared radiation, especially infrared radiation in the range of about 800 nm to about 1200 nm, is typically used for imaging a thermally imageable element. Imaging is conveniently carried out with a laser emitting at about 830 nm or at about 1056 nm. Suitable commercially available imaging devices include image setters such as a CREO® Trendsetter (Creo Corp., Burnaby, British Columbia, Canada) and a Gerber Crescent 42T (available from the Gerber Corporation).

Thermal imaging may be carried out using a hot body, such as a conventional apparatus containing a thermal printing head. A suitable apparatus includes at least one thermal head, but would usually include a thermal head array, such as a TDK Model No. LV5416 used in thermal fax machines and sublimation printers, the GS618-400 thermal plotter (Oyo Instruments, Houston, Tex., USA), or the Model VP-3500 thermal printer (Seikosha America, Mahwah, N.J., USA).

Imaging produces an imaged element, which comprises a latent image of imaged regions and complementary unimaged regions. Development of the imaged element to form a printing plate, or printing form, converts the latent image to an image. The developer penetrates and removes either the imaged or unimaged regions, without substantially removing the complementary regions, revealing the hydrophilic surface of the underlying substrate.

The choice of developer will depend on the composition of the imageable layer and the other layers, if any, in the imageable element. A high pH developer typically has a pH of at least about 11, more typically at least about 12, preferably from about 12 to about 14. High pH developers comprise at least one alkali metal silicate, such as lithium silicate, potassium silicate, and/or, preferably, sodium silicate. In addition to the alkali metal silicate, alkalinity can be provided by a suitable concentration of any suitable base, such as, for example, ammonium hydroxide, sodium hydroxide, lithium hydroxide, and/or potassium hydroxide. Optional components of high pH developers are anionic, nonionic and amphoteric surfactants (up to 3% on the total composition weight), biocides (antimicrobial and/or antifungal agents), antifoaming agents or chelating agents (such as alkali gluconates), and thickening agents (water soluble or water dispersible polyhydroxy compounds such as glycerin or polyethylene glycol). However, these developers typically do not contain organic solvents.

Solvent based alkaline developers, which comprise water and an organic solvent or a mixture of organic solvents, typically have a pH below about 10.5, especially below 10.2. They are typically free of silicates, alkali metal hydroxides, and mixtures of silicates and alkali metal hydroxides. The developer is a single phase. Consequently, the organic solvent or mixture of organic solvents must be either miscible with water or sufficiently soluble in the developer that phase separation does not occur. Optional components include anionic, nonionic and amphoteric surfactants (up to 3 wt %), and biocides (antimicrobial and/or antifungal agents). The following solvents and mixtures thereof are suitable for use in solvent-based developers: the reaction products of phenol with ethylene oxide (phenol ethoxylates) and with propylene oxide (phenol propoxylates), such as ethylene glycol phenyl ether (phenoxyethanol); benzyl alcohol; esters of ethylene glycol and of propylene glycol with acids having six or fewer carbon atoms, and ethers of ethylene glycol, diethylene glycol, and propylene glycol with alkyl groups having six or fewer carbon atoms, such as 2-ethoxyethanol, 2-(2-ethoxy)ethoxyethanol, and 2-butoxyethanol. The developer typically comprises about 0.5 wt % to about 15 wt %, preferably about 3 wt % to about 5 wt %, of the organic solvent or solvents, based on the weight of the developer. Conventionally, high pH developers have been used for multi-layer positive-working imageable elements, and solvent based developers, also known as negative developers, have been used to develop negative-working imageable elements.

Typically, the imaged imageable element is developed in a processor. In an immersion processor, the imaged imageable element is immersed in developer, and the developer circulated around the element. In contrast, in a spray-on processor, the developer is sprayed onto the imaged imageable element, but the element is not immersed in the developer.

Following processing, the resulting printing plate is rinsed with water and dried. Drying may be conveniently carried out by infrared radiators or with hot air. Depending on the nature of the imageable composition, the printing plate may be treated with a gumming solution comprising one or more water-soluble polymers, for example polyvinylalcohol, polymethacrylic acid, polymethacrylamide, polyhydroxyethylmethacrylate, polyvinylmethylether, gelatin, and polysaccharides such as dextrine, pullulan, cellulose, gum arabic, and alginic acid. Depending on the nature of the imageable composition, the developed and gummed plate may be baked, for example, at about 220° C. to about 260° C. for about 5 minutes to about 15 minutes, or at a temperature of about 110° C. to about 130° C. for about 25 to about 35 min to increase the press runlength of the plate.

If appropriate, the imaged imageable element may be developed in water. Although distilled or deionized water may be used, the imaged element typically can be developed in tap water. Although development with tap water will typically be carried out in a processor, rather than on press, it is not necessary to prepare and dispose of expensive, high pH developers when water is used. In addition, only a simple processor is necessary, so expensive processors are not required to develop an imaged imageable element in water.

If appropriate, the imaged imageable element can be directly mounted on press after imaging and developed with ink and/or fountain solution during the initial prints. No separate development step is needed before mounting on press. This eliminates the separate development step along with both the processor and developer, thus simplifying the printing process and reducing the amount of expensive equipment required. The imaged imageable element is mounted on the plate cylinder of a lithographic press and developed with ink and/or fountain solution by rotating the press cylinders and contacting the element with ink and fountain solution. In conventional wet press lithographic printing, fountain solution and then ink are applied to the printing plate. For presses with integrated inking/dampening system, the ink and fountain solution are emulsified by various press rollers before being transferred to the plate as emulsion of ink and fountain solution.

Numerous aqueous fountain solutions are known to those skilled in the art. Fountain solutions are disclosed, for example, in Matsumoto, U.S. Pat. No. 5,720,800; Archer, U.S. Pat. No. 5,523,194; Chase, U.S. Pat. No. 5,279,648; Bondurant, U.S. Pat. Nos. 5,268,025, 5,336,302, and 5,382, 298; Egberg, U.S. Pat. No. 4,865,646; and Daugherty, U.S. Pat. No. 4,604,952. Typical ingredients of aqueous fountain solutions, in addition to water, typically deionized water, include pH buffering systems, such as phosphate and citrate buffers; desensitizing agents, such as dextrin, gum arabic, and sodium carboxymethylcellulose; surfactants and wetting agents, such as aryl and alkyl sulfonates, polyethylene oxides, polypropylene oxides, and polyethylene oxide derivatives of alcohols and phenols; humectants, such as glycerin and sorbitol; low boiling solvents such as ethanol and 2-propanol; sequestrants, such as borax, sodium hexametaphosphate, and salts of ethylenediamine tetraacetic acid; biocides, such as isothiazolinone derivatives; and antifoaming agents. Typical pH ranges for fountain solutions are about 3.7 to about 6.7 for sheet fed presses, and about 7.0 to about 9.6 for web presses.

For on-press imaging, the imageable element is imaged while mounted on a lithographic printing press cylinder, and the imaged imageable element is developed on press with fountain solution during the initial press operation. This method does not comprise a separate development step. This method is especially suitable for computer-to-press applications in which the imageable element (or elements, for multiple color presses) is directly imaged on the plate cylinder according to computer generated digital imaging information and, with minimum or no treatment, directly prints out regular printed sheets. On-press imaging may be carried out on, for example, a Quickmaster DI 46-4 press (Heidelberger Druckmaschinen, Heidelberg, Germany).

INDUSTRIAL APPLICABILITY

The use of the interlayers of the invention improves resistance of the substrate to alkaline developers. In addition, the interlayers simplify substrate manufacture by eliminating materials such as sodium silicate and phosphate fluoride, which attack the aluminum oxide layer of the substrate during manufacture and produce insoluble products, resulting in significant downtime in the manufacturing process to conduct the necessary cleaning operations. The interlayers also resist stain and maintain adhesion of both positive and negative-type working imageable layers, reducing the need of multiple post-treatment chemistries and equipment for a substrate manufacturing line. This improves yield, decreases waste, and reduces downtime for changeover and cleaning. The interlayers also improve the adhesion press developable imageable layers to sulfuric acid anodized aluminum substrates.

Once the imageable element has been imaged and developed to form a lithographic printing plate, printing can then be carried out by applying a fountain solution and then lithographic ink to the image on its surface. The fountain solution is taken up by the surface of the hydrophilic substrate revealed by the imaging and development process, and the ink is taken up by the regions not removed by the development process. The ink is then transferred to a suitable receiving material (such as cloth, paper, metal, glass or plastic) either directly or indirectly using an offset printing blanket to provide a desired impression of the image thereon.

The advantageous properties of this invention can be observed by reference to the following examples, which illustrate but do not limit the invention.

EXAMPLES

Except where indicated, the indicated percentages are percentages by weight based on the total solids in the coating solution.

Glossary

AIBN 2,2'-Azobisisobutyronitrile (DuPont, Wilmington, Del., USA)

Binder A Co-polymer of styrene and poly(ethylene glycol) methyl ether methacrylate (90:10) (See Example 13)

Binder B Co-polymer of poly(ethylene glycol) methyl ether methacrylate, styrene, and acrylonitrile (10:20:70) (See Example 14)

BYK 307 Surfactant; polyethoxylated dimethylpolysiloxane co-polymer (Byk Chemie, Wallingford, Conn., USA)

BYK 336 Modified dimethyl polysiloxane co-polymer in a 25% xylene/methoxypropyl acetate solution (Byk Chemie, Wallingford, Conn., USA)

Co-polymer 1 (C 1) Vinyl phosphonic acid/acrylic acid/TMSPMA (60/30/10, by weight (see Example 4)

Co-polymer 2 (C 2) Vinyl phosphonic acid/TSPMA (90/10, by weight) (see Example 5)

Co-polymer 3 Co-polymer of poly(ethylene glycol) methyl ether methacrylate and acrylic acid (30:70) (See Example 15)

CREO® Trendsetter 4300 Commercially available platesetter, operating at a wavelength of 830 nm (Creo Products, Burnaby, BC, Canada)

D11 Ethanaminium, N-[4-[[4-(diethylamino)phenyl][4-(ethylamino)-1-naphthalenyl]methylene]-2,5-cyclohexadien-1-ylidene]-N-ethyl-, salt with 5-benzoyl-4-hydroxy-2-methoxybenzenesulfonic acid (1:1); colorant dye (see structure below) (PCAS, Longjumeau, France)

Goldstar™ Plus developer Developer containing sodium metasilicate pentahydrate (Kodak Polychrome Graphics, Norwalk, Conn., USA)

IR Dye A 2-[2-[2-Chloro-3-[2-(1,3-dihydro-1,3,3-trimethyl-2H-benzeindol-2-ylidene)ethylidene]-1-cyclohexen-1-yl] ethenyl]-1,3,3-trimethyl-1H-benzeindolium 4-methyl-benzenesulfonate (Eastman Kodak, Rochester, N.Y., USA) (see structure below)

IR Dye B 1H-Benz(e)indolium, 2-(2-(3-((1,3-dihydro-1,1-dimethyl-3-(2-acetoxybutyl)-8-sulfonato-2H-benz(e)indol-2-ylidene)ethylidene)-2-(diphenylamino)-1-cyclopenten-1-yl)ethenyl)-1,1-dimethyl-3-(2-acetoxybutyl)8-sulfonato-, sodium salt (see structure below)

IRGACURE® 250 Cationic iodonium photoinitiator (Ciba Specialty Chemicals, Tarrytown, N.Y., USA)

KLUCEL® 99 M 2% Hydroxypropyl cellulose in water (Hercules, Wilmington, Del., USA)

Mercapto-3-traizole Mercapto-3-triazole-1H, 2, 4 (PJS Chemicals, Tadcaster, UK)

MSFPF6 2-Methoxy-4-aminophenyl diazonium hexafluorophosphate (Diversitec, Ft. Collins, CO, USA)

N-13 Novolac resin; 100% m-cresol; MW 13,000 (Eastman Kodak Rochester, N.Y., USA)

Resole resin GP649D99 (Georgia-Pacific, Atlanta, Ga., USA)

PEGMA Polyethylene glycol methacrylate, MW 2,080, 50% solution in water (Aldrich, Milwaukee, Wis., USA)

PROTHERM® developer aqueous alkaline developer (Kodak Polychrome Graphics, Norwalk, Conn., USA)

PVPA Polyvinylphosphonic acid (Clariant, Wiesbaden, Germany)

Substrate A Electrochemically grained, sulfuric acid anodized aluminum with no interlayer (see Example 1)

Substrate B Electrochemically grained, sulfuric acid anodized aluminum with no interlayer (see Example 2)

Substrate C Electrochemically grained, sulfuric acid anodized aluminum with poly vinylphosphonic acid interlayer (see Example 3)

TYZOR® TE Titanium chelate; titanium(triethanolamineaminato) isopropoxide (DuPont, Wilmington, Del., USA)

Urethane Acrylate 80% 2-butanone solution of a urethane acrylate obtained by reaction of DESMODUR® N100 and hydroxyethyl acrylate and pentaerythrol triacrylate VPA:AA Polyvinylphosphonic acid/acrylic acid co-polymer (30:70 mol %) (Rhodia, Cranbury, N.J., USA)

TMSPMA 3-(Trimethoxysilyl) propyl methacrylate (Aldrich, Milwaukee, Wis., USA) VPA Vinyl phosphonic acid (Clariant, Wiesbaden, Germany)

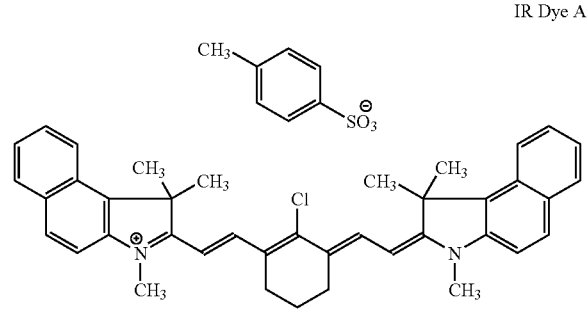

IR Dye A

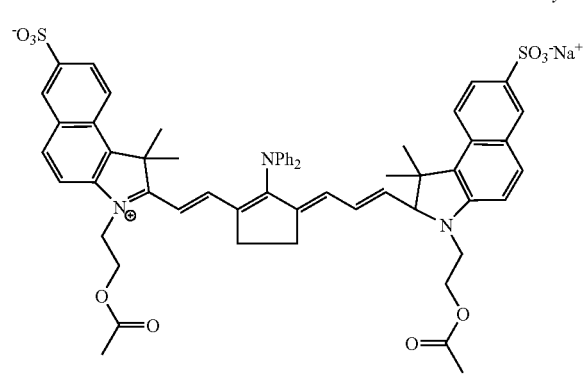

IR Dye B

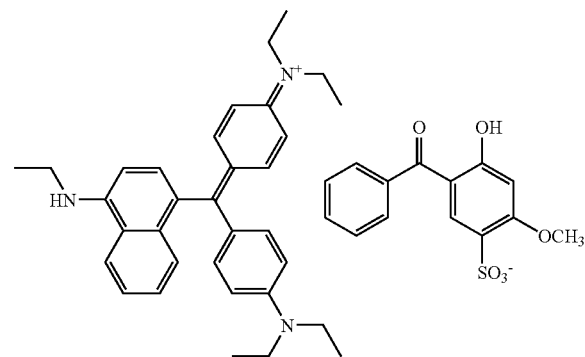

D11

Example 1

This example illustrates the preparation of Substrate A, an aluminum substrate without an interlayer. A 0.30 mm thick aluminum sheet was alkaline cleaned, electrochemically grained with hydrochloric acid, etched in a caustic solution, anodized in sulfuric acid, and thoroughly rinsed and dried using conventional procedures. The resultant non-post-treated substrate had a $D_{min}$ of 0.36 (K), oxide weight of 2.5 g/m$^2$, and a $R_a$ roughness of 0.580 microns. The oxide layer had a thickness of 1 micron.

Example 2

This example illustrates the preparation of Substrate B, an aluminum substrate without an interlayer. The aluminum substrate was prepared as in Example 1, except that the anodization process was performed in the laboratory using a dip-anodizing process, unlike the continuous web anodization process used Example 1 and Comparative Example 1. The support was dipped into a 25% solution of sulfuric acid for 50 sec at 25° C. A direct current was applied through a graphite electrode such that the applied current density was 8.1 A/dm$^2$ and the charge density was 405 C/dm$^2$. The support was removed, rinsed with water, and pressure dried.

Example 3

This example illustrates the preparation of Substrate C, an aluminum substrate with a PVPA interlayer. Immediately after the anodizing and rinsing process, the aluminum substrate from Example 1 was treated at 65° C. with a 0.3% solution of PVPA in water. The immersion time was 13 sec. The substrate was then rinsed and dried.

Example 4

This example illustrates the preparation of Co-polymer 1 ("C 1"), an interlayer material of the invention. 21.2 g of n-propanol, 30.3 g of deionized water, 30 g of a VPA solution, 15 g of acrylic acid, and 5 g TMSPMA were charged into 500 ml, 4-neck ground glass flask equipped with a heating mental, glass thermometer, mechanical stirrer, nitrogen inlet and condenser. 0.25 g of AIBN was added at room temperature with stirring. The resulting reaction mixture heated slowly to 78° C. After 3 hr, an additional 0.25 g of AIBN was added. After an additional 9.5 hr of heating at 78° C., conversion was >98% based on determination of percent non-volatiles. The ratio of vinyl phosphonic acid/acrylic acid/TMSPMA was 60/30/10 by weight.

Example 5

This example illustrates the preparation of Co-polymer 2 ("C 2"), an interlayer material of the invention. 121.2 g of n-propanol, 30.3 g of deionized water, 45 g of vinyl phosphonic acid, and 5 g of TSPMA were charged into 500 ml 4-neck ground glass flask equipped with a heating mental, glass thermometer, mechanical stirrer, nitrogen inlet and condenser. 0.25 g of AIBN was added with stirring at room temperature. The reaction mixture was allowed to heat slowly to 78° C. Total of 0.5 g of AIBN was added in two intervals over 6 hr. After an additional 9.5 hr, the co-polymer conversion was >95.8% based on the percent non-volatiles. The weight ratio of vinyl phosphonic acid/TSPMA was 90/10 by weight. The n-propanol/deionized water ratio was 80:20.

Example 6

A 0.3% aqueous solution was made for each of the three interlayer materials: PVPA, the co-polymer of Example 4 ("C 1") and the co-polymer of Example 5 ("C 2"). Each interlayer material was applied to the substrate from Example 1 (Substrate A) using a bar-coater device, then immediately dried at 87° C. for 30 sec. The dry coating weight of each interlayer was about 0.75 g/m². Half of the treated substrates were rinsed with water for 15 sec, then pressure dried between squeeze rollers.

Example 7

Substrates from Examples 1, 2, and 3 were each immersed in a tank filled with a solution of 0.3% of the interlayer materials: PVPA, VPA:AA, the co-polymer from Example 4, and the co-polymer from Example 5. The solutions were held at 65° C. The substrates were immersed for 15 sec prior to being water spray rinsed and pressure dried. This is known as a post anodic treatment (PAT).

Example 8

Substrates from Examples 1, 2, and 3 were each placed on a 1.8 meter diameter stainless steel drum, heated to 85° C. The substrates were held to the drum with magnets. The interlayer materials were all 0.3% solids solutions applied at a wet coverage of 15.5 ml/m². The interlayer materials were pumped through a hopper placed on the substrates as they rotated, and then dried. Drying times varied from 45 to 90 sec.

Example 9

The substrates were evaluated by the following procedures.

Hydrogen Evolution The rate of hydrogen evolution (bubbling) of coupons (5×13 cm samples cut from the prepared metal) from Example 6 immersed in Goldstar™ Plus developer was determined. The rate was determined visually to be lowest for substrates containing a layer of Co-polymer 1, followed those containing a layer of Co-polymer 2, followed those containing a layer of VPA:AA, followed those containing a layer of PVPA. There was no difference between water rinsed and non-rinsed interlayers.

The coupons were visually examined for corrosion products during the test and after 3 to 10 min immersion. Those containing a layer of either interlayer material of the invention, Co-polymer 1 or Co-polymer 2, had minor corrosion. The coupon containing a layer of VPA:AA had moderate corrosion, and the coupon containing a layer of PVPA had severe corrosion.

Drop Test A drop of a solution of zinc oxide and aluminum phosphate was placed on the interlayer, and the time for the solution to penetrate the interlayer measured and aluminum oxide layer measured. Penetration of the oxide layer is indicated by a black appearance of the aluminum. This test has shown good correlation to resistance in alkali media. The results are shown in Table 1.

TABLE 1

| Interlayer | Time to oxide penetration (sec) | Time to bubbling (hydrogen evolution) (sec) |
|---|---|---|
| PVPA | 13 | 15 |
| VPA:AA | 26 | 36 |
| Co-polymer 1 | 32 | 47 |
| Co-polymer 2 | 30 | 43 |

Example 10

Substrates from Examples 1 and 2 were treated according to Examples 6 and 7 with Co-polymer 1 or with Co-polymer 2. An imageable layer designed to develop on press was applied to the substrates using a hopper at a wet coverage of 30.6 cc/m² and dried on a metal drum for 90 sec at 82° C. as a continuous process. The coating solution was prepared by dissolving the ingredients listed in Table 2 in a coating solvent of 1-propanol (76 parts), methyl ethyl ketone (4 parts), and water (20 parts). The resulting coating solution typically contained about 5.5 wt % total solids.

TABLE 2

| Component | Parts by Weight (%) |
|---|---|
| Urethane Acrylate | 30.00 |
| Binder A | 57.17 |
| KLUCEL ® 99M | 1.00 |
| IRGACURE ® 250 | 4.78 |
| Mercapto-3-triazole | 2.78 |
| BYK 336 | 2.27 |
| IR Dye B | 2.00 |

Some of the resulting imageable elements were aged for 6 days at 80° C. under dry conditions, or aged for 5 days at 40° C. and 80% relative humidity. Non-aged and aged imageable elements were subsequently imaged at 100, 200, and 300 mJ/cm with a CREO® Trendsetter. The image contained a portrait, a UGRA scale, and solid patches.

The imaged imageable elements were loaded on a AB Dick 9870 duplicator press (A. B. Dick, Niles, Ill., USA). The press was charged with Van Son Rubber Base black Ink (Van Son Ink, Mineola, N.Y., USA). The aqueous fountain solution contained about 23.5 ml/L (3 oz per gallon) Varn Litho Etch142W (Varn International, Addison, Ill., USA), and about 23.5 ml/L (3 oz per gallon) Varn PAR (alcohol substitute) in water. The developing procedure is to wet a non-abrasive rag with fountain solution and apply solution to the plate with gentle rubbing. The press is then started and the damping system engaged for 20 revolutions to further wet the plate with fountain solution. Then, the inking system is engaged for 20 revolutions.

A rating of 1 indicates the image has mostly fallen off. A rating of 2 indicates minor wear, typically the 1×1 pixel is completely removed. A rating of 3 indicates no loss of image. Ratings are given in Table 3. The number of press sheets required to obtain a clean non-image area free of ink ("Cleanout") was also determined.

TABLE 3

| Sub-strate | PAT | Sub-layer | Aging | Adhesion Rating 100 mJ/cm² | 200 mJ/cm² | 300 mJ/cm² | Cleanout[a] |
|---|---|---|---|---|---|---|---|
| C | PVPA | | Fresh | 1 | 2 | 3 | 1 |
| C | PVPA | C 1 | Fresh | 2 | 3 | 3 | 1 |
| A | C 1 | | Fresh | 2 | 3 | 3 | 1 |
| A | | C 1 | Fresh | 3 | 3 | 3 | 250 (light stain) |

[a]Number of press sheets required to obtain a clean non-image area free of ink

Example 11

A coating solution was prepared by dissolving the ingredients listed in Table 4 in a coating solvent containing 1-propanol (76 parts), methyl ethyl ketone (4 parts), and water (20 parts). The resulting coating solution typically contained about 5.5 wt % total solids.

TABLE 4

| Component | Parts by Weight (%) |
|---|---|
| Urethane Acrylate | 30.00 |
| Binder B | 46.09 |
| Sartomer SR355 | 4.90 |
| ELVACITE ® 4026 | 4.90 |
| KLUCEL ® 99M | 1.00 |
| IRGACURE ® 250 | 4.69 |
| Mercapto-3-triazole | 2.73 |
| BYK 336 | 2.23 |
| IR Dye B | 1.96 |
| Co-polymer 3 | 0.50 |
| TYZOR ® TE | 1.00 |

The imageable elements were imaged and evaluated as described in Example 10. The evaluations are given in Table 5.

TABLE 5

| Sub-strate | PAT | Sub-layer | Aging | Adhesion Rating 100 mJ/cm² | 200 mJ/cm² | 300 mJ/cm² | Cleanout[a] |
|---|---|---|---|---|---|---|---|
| C | PVPA | | Fresh | 2 | 3 | 3 | 1 |
| C | PVPA | | Humid Aged (3 days) | 2 | 3 | 3 | 1 |
| C | PVPA | | Dry Aged (3 days) | 2 | 3 | 3 | 1 |
| C | PVPA | C1 | Fresh | 2 | 3 | 3 | 1 |
| C | PVPA | C1 | Humid Aged | 3 | 3 | 3 | 250 (light stain) |

TABLE 5-continued

| Sub-strate | PAT | Sub-layer | Aging | Adhesion Rating 100 mJ/cm² | 200 mJ/cm² | 300 mJ/cm² | Cleanout[a] |
|---|---|---|---|---|---|---|---|
| C | PVPA | C1 | Dry Aged | 3 | 3 | 3 | 1 |
| C | PVPA | C2 | Fresh | 2 | 2 | 3 | 1 |
| C | PVPA | C2 | Humid Aged | 2 | 3 | 3 | 1 |
| C | PVPA | C2 | Dry Aged | 2 | 3 | 3 | 1 |
| A | | C2 | Fresh | 3 | 3 | 3 | 1 |
| A | | C2 | Humid Aged | 3 | 3 | 3 | 1 |
| A | | C2 | Dry Aged | 3 | 3 | 3 | 1 |

[a]Number of press sheets required to obtain a clean non-image area free of ink

Example 12

This example illustrates use of the substrates with a negative working preheat diazo formulation. The substrates shown in Table 6 were coated with the following formulation: 6.8 g of 25% resole resin in PGME; 8.4 g of 34% N-13 in acetone; 0.75 g of MSFP6; 0.47 g of IR Dye A; 0.39 g of terephthaldicarboxaldehyde; 0.02 g of D-11; 0.2% of BYK 307; 80 g of 1-methoxy-2-propanol; and 3 g of acetone. The imageable layer was coated as in Example 10 and dried 85° C. for 90 sec. The coating solution applied at a wet coverage of 27.8 ml/m².

Some of the resulting imageable elements were aged for 5 days at 40° C. and 80% relative humidity and the fog point determined. The fog point is defined as the lowest temperature, at a heating time of one minute, required to render a thermally imageable element non-processable (i.e., non-imaged background coating is not completely removed). When the imaged imageable element is heated above the fog point, the unimaged regions crosslink. Because the unimaged regions are not removed by developer, no image is formed. It is a measure of the highest preheat temperature that can cross-link the non-image areas resulting in the background not fully developing off in the processor.

To determine fog point, the imageable element was imaged on the CREO® Trendsetter at exposure energy of 118 mJ/cm². Then, the imaged imageable element was cut into about 12 cm×68 cm pieces, and the pieces were sent through a SPC 48/127 Oven at various temperatures. After the preheat step, the preheated imageable elements enter a processor containing PROTHERM® developer. The fog point was determined by visual observation of minor imageable layer retention in the background area following development.

As measured by fog point, Substrate B, with a PVPA interlayer produced a slightly faster plate (thermally) than Substrate C with a PVA interlayer. The fog point of imageable elements containing the interlayers of the invention on Substrate B was consistent for fresh and aged imageable elements and was the same as that for imageable elements containing a PVPA interlayer of Substrate B. This indicates that the preheat temperature does not need to be changed when an interlayer of the invention is used instead of a PVPA interlayer.

TABLE 6

| Substrate | PAT | Sublayer | Condition | Fog Point |
|---|---|---|---|---|
| C | PVPA | | Fresh | 134° C. |
| C | PVPA | | Aged | 134° C. |
| B | | PVPA | Fresh | 133° C. |
| B | | PVPA | Aged | 132° C. |
| B | | C 1 | Fresh | 133° C. |
| B | | C 1 | Aged | 133° C. |
| B | | C 2 | Fresh | 133° C. |
| B | | C 2 | Aged | 133° C. |

Example 13

This example illustrates the synthesis of Binder A. PEGMA (50% solution in water) (15 g), water (40.5 g), and 1-propanol (192 g) were charged into a 500 ml flask, equipped with condenser, mechanic stirring, temperature controller and nitrogen inlet. The mixture was heated to 80° C. under nitrogen. Styrene (66.9 g) and AIBN (0.48 g) were mixed and part of this solution (12 g) added to the reaction mixture, which became hazy in about 10 min. The rest of the AIBN solution was added over 30 min. After 3 additional hours, the conversion to co-polymer was about 97%, based on the non-volatiles. The weight ratio of styrene to PEGMA in the binder was about 90:10.

Example 14

This example illustrates the synthesis of Binder B. PEGMA (20 g of a 50% solution in water) dissolved in a mixture of 74.8 g of deionized water and 241.4 g of n-propanol was charged into a 1 L 4-neck flask and the reaction mixture was heated slowly to slight reflux (76° C.) under a nitrogen atmosphere. A pre-mixture of 20.0 g of styrene, 70 g of acrylonitrile and 0.7 gr of AIBN was added over a 2 hr period. After 6 hr another 0.5 g of AIBN was added. During processing, the reaction temperature was increased to 80° C. Then two additional 0.35 g portions of AIBN were added over the period of 6 hr. Heating was continued. After 19 hr, the conversion to co-polymer was >98% based on the percent non-volatiles. The weight ratio of PEGMA/styrene/acrylonitrile was 10:20:70 and the n-propanol/water ratio is 76:24. The residual acrylonitrile in solution was 0.5% based on determination by $^1$H-NMR.

Example 15

This example illustrates the synthesis of a PEGMA/acrylic acid co-polymer. PEGMA (50% solution in water) (42 g), 1-propanol (169.4 g), and deionized water (21.4 g), were charged into 500-ml flask and heated to 80° C. under a nitrogen atmosphere. Acrylic acid (49 g) and AIBN (0.49 g) were mixed in a beaker and part of this solution (8 g) was added. After 0.5 hr, the remaining solution was added over a period of 2 hr and the reaction mixture heated for a further 3 hr. Polymer conversion was 99% based on the % of non-volatiles. The final viscosity was B-C (G'H-'33), approximately 75 cps. The weight ratio of polyethylene glycol methacrylate to acrylic acid was 30:70.

When the reaction was carried out in water using ammonium per sulfate as an initiator, either with or without dodecyl sulfate sodium salt, the reaction mixture became gummy. Therefore, a preferred solvent for this synthesis is a 80:20 by weight mixture of n-propanol/water.

What is claimed is:

1. A substrate comprising, a support and an interlayer on the support, in which:
    the support comprises aluminum or an aluminum alloy;
    the interlayer comprises an interlayer material;
    the interlayer material is a co-polymer comprising K units and L units;
    K is selected from —[$CH_2C(R^1)CO_2H$]—, —[$CH_2CH(PO(OH)_2)$]—, and mixtures thereof;
    L is —[$CH_2C(R^2)(WSi(OR^3)_3)$]—;
    $R^1$ is hydrogen, methyl, or a mixture thereof;
    $R^2$ is hydrogen, methyl, or a mixture thereof;
    W is a bivalent linking group, a combination of bivalent linking groups, or a mixture of bivalent linking groups; and
    each $R^3$ is independently phenyl, or alkyl of one to six carbon atoms.

2. The substrate of claim 1 in which K is —[$CH_2CH(PO(OH)_2)$]—.

3. The substrate of claim 2 in which W is a carbon-silicon single bond or —$CO_2(CH_2)_m$—, in which m is 2 to 6.

4. The substrate of claim 3 in which each $R^3$ is methyl or ethyl.

5. The substrate of claim 1 in which K is —[$CH_2C(R^1)CO_2H$]—.

6. The substrate of claim 5 in which $R^1$ is hydrogen or methyl; W is a carbon-silicon single bond or —$CO_2(CH_2)_m$—, in which m is 2 to 6; and each $R^3$ is methyl or ethyl.

7. The substrate of claim 1 in which K is a mixture of —[$CH_2C(R^1)CO_2H$]— and —[$CH_2CH(PO(OH)_2)$]—.

8. The substrate of claim 7 in which $R^1$ is hydrogen or methyl; W is a carbon-silicon single bond or —$CO_2(CH_2)_m$—, in which m is 2 to 6; and each $R^3$ is methyl or ethyl.

9. The substrate of claim 1 additionally comprising an imageable layer over the interlayer.

10. The substrate of claim 9 in which K is —[$CH_2CH(PO(OH)_2)$]—.

11. The substrate of claim 10 in which W is a carbon-silicon single bond or —$CO_2(CH_2)_m$—, in which m is 2 to 6.

12. The substrate of claim 11 in which each $R^3$ is methyl or ethyl.

13. The substrate of claim 9 in which K is —[$CH_2C(R^1)CO_2H$]—.

14. The substrate of claim 13 in which $R^1$ is hydrogen or methyl; W is a carbon-silicon single bond or —$CO_2(CH_2)_m$—, in which m is 2 to 6; and each $R^3$ is methyl or ethyl.

15. The substrate of claim 9 in which K is a mixture of —[$CH_2C(R^1)CO_2H$]— and —[$CH_2CH(PO(OH)_2)$]—.

16. The substrate of claim 15 in which $R^1$ is hydrogen or methyl; W is a carbon-silicon single bond or —$CO_2(CH_2)_m$—, in which m is 2 to 6; and each $R^3$ is methyl or ethyl.

17. An imageable element comprising an imageable layer over a substrate, in which:
    the substrate comprises, a support and an interlayer on the support;
    the support comprises aluminum or an aluminum alloy;
    the interlayer comprises an interlayer material;
    the interlayer material is a co-polymer comprising K units and L units;
    K is selected from —[$CH_2C(R^1)CO_2H$]—, —[$CH_2CH(PO(OH)_2)$]—, and mixtures thereof;
    L is —[$CH_2C(R^2)(WSi(OR^3)_3)$]—;

$R^1$ is hydrogen, methyl, or a mixture thereof;

$R^2$ is hydrogen, methyl, or a mixture thereof;

W is a bivalent linking group, a combination of bivalent linking groups, or a mixture of bivalent linking groups; and each $R^3$ is independently phenyl, or alkyl of one to six carbon atoms.

18. The imageable element of claim 17 in which the imageable layer comprises a polymeric diazo resin, and the imageable layer is on the interlayer.

19. The imageable element of claim 18 in which K is $-[CH_2CH(PO(OH)_2)]-$; W is a carbon-silicon single bond or $-CO_2(CH_2)_m-$, m is 2 to 6; and each $R^3$ is methyl or ethyl.

20. The imageable element of claim 18 which K is $-[CH_2C(R^1)CO_2H]-$; $R^1$ is hydrogen or methyl; W is a carbon-silicon single bond or $-CO_2(CH_2)_m-$, m is 2 to 6; and each $R^3$ is methyl or ethyl.

21. The imageable element of claim 17 in which the imageable layer comprises negative working imageable composition that comprises a monomer and a free radical generating system.

22. The imageable element of claim 21 in which K is $-[CH_2CH(PO(OH)_2)]-$; W is a carbon-silicon single bond or $-CO_2(CH_2)_m-$, m is 2 to 6; and each $R^3$ is methyl or ethyl.

23. The imageable element of claim 21 which K is $-[CH_2C(R^1)CO_2H]-$; $R^1$ is hydrogen or methyl; W is a carbon-silicon single bond or $-CO_2(CH_2)_m-$, m is 2 to 6; and each $R^3$ is methyl or ethyl.

24. The imageable element of claim 17 in which the imageable layer comprises phenolic resin and a dissolution inhibitor.

25. The imageable element of claim 24 in which K is $-[CH_2CH(PO(OH)_2)]-$; W is a carbon-silicon single bond or $-CO_2(CH_2)_m-$, m is 2 to 6; and each $R^3$ is methyl or ethyl.

26. The imageable element of claim 24 which K is $-[CH_2C(R^1)CO_2H]-$; $R^1$ is hydrogen or methyl; W is a carbon-silicon single bond or $-CO_2(CH_2)_m-$, m is 2 to 6; and each $R^3$ is methyl or ethyl.

27. The imageable element of claim 17 in which the element additionally comprises an underlayer between the interlayer and the imageable layer.

28. The imageable element of claim 27 in which K is $-[CH_2CH(PO(OH)_2)]-$; W is a carbon-silicon single bond or $-CO_2(CH_2)_m-$, m is 2 to 6; and each $R^3$ is methyl or ethyl.

29. The imageable element of claim 27 which K is $-[CH_2C(R^1)CO_2H]-$; $R^1$ is hydrogen or methyl; W is a carbon-silicon single bond or $-CO_2(CH_2)_m-$, m is 2 to 6; and each $R^3$ is methyl or ethyl.

30. A method for forming an image, the method comprising the steps of:

providing an imageable element comprising:

a substrate comprising, in order, a support, and an interlayer, and an imageable layer over the interlayer;

thermally imaging the imageable element and forming an imaged imageable element comprising imaged regions and complementary unimaged regions in the imageable layer;

developing the imaged imageable element and removing one of the imaged regions and the unimaged regions;

in which:

the substrate comprises, a support and an interlayer on the support;

the support comprises aluminum or an aluminum alloy;

the interlayer comprises an interlayer material;

the interlayer material is a co-polymer comprising K units and L units;

K is selected from $-[CH_2C(R^1)CO_2H]-$, $-[CH_2CH(PO(OH)_2)]-$, and mixtures thereof;

L is $-[CH_2C(R^2)(WSi(OR^3)_3)]-$;

$R^1$ is hydrogen, methyl, or a mixture thereof;

$R^2$ is hydrogen, methyl, or a mixture thereof;

W is a bivalent linking group, a combination of bivalent linking groups, or a mixture of bivalent linking groups; and each $R^3$ is independently phenyl, or alkyl of one to six carbon atoms.

31. The method of claim 30 in which K is $-[CH_2CH(PO(OH)_2)]-$; W is a carbon-silicon single bond or $-CO_2(CH_2)_m-$, m is 2 to 6; and each $R^3$ is methyl or ethyl.

32. The method of claim 30 which K is $-[CH_2C(R^1)CO_2H]-$; $R^1$ is hydrogen or methyl; W is a carbon-silicon single bond or $-CO_2(CH_2)_m-$, m is 2 to 6; and each $R^3$ is methyl or ethyl.

* * * * *